United States Patent
Motz et al.

(10) Patent No.: US 10,261,137 B2
(45) Date of Patent: Apr. 16, 2019

(54) MAGNETIC SENSOR

(71) Applicant: Infineon Technologies AG, Neubiberg (DE)

(72) Inventors: Mario Motz, Wernberg (AT); Leneesh Raghavan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 398 days.

(21) Appl. No.: 14/935,871

(22) Filed: Nov. 9, 2015

(65) Prior Publication Data
US 2017/0131366 A1    May 11, 2017

(51) Int. Cl.
  *G01R 33/02* (2006.01)
  *G01R 33/00* (2006.01)
  *G01R 33/07* (2006.01)

(52) U.S. Cl.
  CPC ......... *G01R 33/0029* (2013.01); *G01R 33/07* (2013.01)

(58) Field of Classification Search
  CPC .......................... G01R 33/0029; G01R 33/07
  See application file for complete search history.

(56) References Cited

U.S. PATENT DOCUMENTS

| | | | |
|---|---|---|---|
| 6,032,109 A | 2/2000 | Ritmiller, III | |
| 2009/0128131 A1* | 5/2009 | Kobayashi | G01D 3/022 324/120 |

FOREIGN PATENT DOCUMENTS

| | | |
|---|---|---|
| CN | 101813757 A | 8/2010 |
| CN | 102820862 A | 12/2012 |
| CN | 103140770 A | 6/2013 |
| DE | 10062292 A1 | 3/2002 |
| DE | 10154498 A1 | 5/2003 |
| EP | 0525235 A1 | 2/1993 |
| WO | 2012050711 A1 | 4/2012 |
| WO | WO-2016/161357 A1 | 10/2016 |

OTHER PUBLICATIONS

Office Action dated Jul. 21, 2017 for German Patent Application No. 102016120182.0.
Melexis: MLX 90251—Programmable Linear Hall Effect Sensor—Oct. 2012 https://www.melexis.com/-/media/files/documents/datasheets/mlx90251-datasheet-melexis.pdf.
Office Action dated Jan. 24, 2019 issued for Chinese Patent Application No. 201610984042.2.

* cited by examiner

*Primary Examiner* — David M. Gray
*Assistant Examiner* — Michael A Harrison
(74) *Attorney, Agent, or Firm* — Schiff Hardin LLP

(57) ABSTRACT

A sensor including a sensing device and a processor. The sensing device can be configured to sense one or more environmental conditions, such as one or more magnetic fields, and generate a sensor signal based on the sensed environmental condition(s). The processor can be configured to determine a gain mode and/or a zero-point mode of the sensor. Based on the determined gain and/or zero-point modes and the sensor signal, the processor can generate an output signal. The processor can include a voltage generator configured to generate a ratiometric voltage and/or a regulated voltage based on a supply voltage of the sensor. The processor can receive an external voltage. The gain mode and/or the zero-point mode can be independently determined based on the ratiometric, regulated, or external voltages. The ratiometric or regulated voltage can be output as a second output to form a differential output.

18 Claims, 14 Drawing Sheets

MAGNETIC SENSOR

BACKGROUND

Field

Embodiments described herein generally relate to sensors, including magnetic sensor having ratiometric and/or fixed zero-point and/or gain configurations.

Related Art

Hall Effect devices are solid state electron devices that operate in response to a magnetic field based upon the Hall Effect principle, a phenomenon by which a voltage differential is generated across an electrically conducting body in the presence of a magnetic field. Conventional Hall Effect devices can include a planar structure, known as a Hall plate, which is configured to generate an output signal (e.g., either voltage or current) corresponding to an applied magnetic field.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

Figure 1:
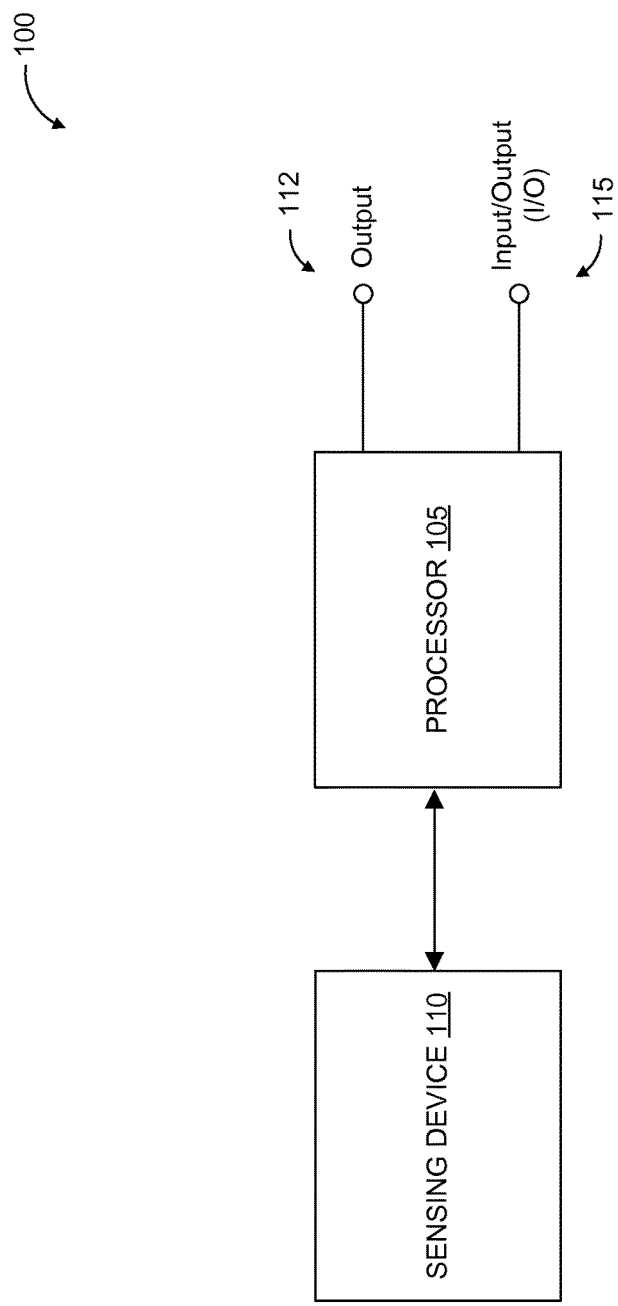
FIG. 1 illustrates a sensor according to an exemplary embodiment of the present disclosure.

FIG. 1 illustrates a sensor 100 according to an exemplary embodiment of the present disclosure. The sensor 100 can include a sensing device 110 electrically (and also communicatively) connected to processor 105.

The sensing device 110 can include processor circuitry configured to sense or detect one or more environmental conditions, and to generate one or more signals based on the sensed/detected environmental conditions. For example, the sensing device 110 can be a magnetic field sensing device, such as a Hall Effect device (e.g., Hall plates), configured to generate a sensor signal in response to the presence of a magnetic field (B). For example, the sensing device 110 can be a magnetic field sensing device that is configured to generate a voltage differential in the presence of the magnetic field. In operation, the voltage differential can be proportional to the applied magnetic field. The sensing device 110 can provide the generated sensor signal to the processor 105. Further, the sensing device 100 can be configured to receive one or more signal from the processor 105 to control the operation of the sensing device 110. For the purpose of the this discussion, the sensing device 110 will be referred to as the magnetic field sensing device 110, but is not limited thereto.

In operation, the magnetic field sensing device 110 generates a zero-field output voltage ($V_{zero}$) that corresponds to the output voltage with no magnetic field present. The zero-field output voltage ($V_{zero}$) can also be referred to as the "zero-point," the "zero-point voltage," or the "voltage offset." In exemplary embodiments, the zero-field output voltage ($V_{zero}$) can be programmable, and can have a range of, for example, 3% to 19% of the supply voltage ($V_{DD}$) of the sensor, 40% to 60% of $V_{DD}$, or another $V_{DD}$ proportional range as would be understood by those skilled in the relevant arts. The zero-field output voltage ($V_{zero}$) can also be, for example, 50% of the $V_{DD}$. In other embodiments, the zero-field output voltage ($V_{zero}$) can be a fixed (e.g., regulated) voltage independent of the $V_{DD}$. In an exemplary embodiment, the value of zero-field output voltage ($V_{zero}$) can be an externally provided voltage received by the processor 105 via the Input/Output (I/O) 115. For example, a device (e.g., a microprocessor of the device) implementing the sensor 100 can provide the external $V_{zero}$ value. In an exemplary embodiment, a reference output signal of an external microprocessor can provide $V_{zero}$, where this microprocessor can also receive the output signal 112.

The processor 105 can include processor circuitry configured to process one or more sensor signals received from the magnetic field sensing device 110 and generate one or more output signals based on the received sensor signal(s). The processor circuitry can be configured to control the overall operation of the sensor 100, such as the operation of the magnetic field sensing device 110 and/or the operation of the processor 105. The processor 105 can be, for example, a signal processor, but is not limited thereto.

In exemplary embodiments, the processor 105 can be configured to process sensing/sensor signals from the magnetic field sensing device 110 to generate one or more output signals having corresponding zero-field output voltage ($V_{zero}$) components that are: ratiometric, fixed or substantially fixed, and/or externally provided. For example, the processor 105 can be configured to generate an output signal having a: ratiometric zero-field output voltage ($V_{zero}$) that is proportional to the $V_{DD}$, a fixed or substantially fixed $V_{zero}$, or a $V_{zero}$ corresponding to an externally provided voltage ($V_{external}$) received by the processor 105 via the Input/Output (I/O) 115. That is, the sensor 100 can have a ratiometric zero-point, a fixed or substantially fixed zero-point, or an externally provided zero-point. In these examples, the mode of operation of the sensor 100 can be referred to as a ratiometric zero-point mode, a fixed or substantially fixed zero-point mode, or an externally provided zero-point mode, respectively.

The processor 105 can also be configured to process sensing signals from the magnetic field sensing device 110 to generate one or more output signals having corresponding gain components that are: ratiometric, fixed or substantially fixed, and/or externally provided. For example, the processor 105 can be configured to generate an output signal having a: ratiometric gain proportional to the $V_{DD}$, a fixed or substantially fixed gain, or a gain determined based on an externally provided voltage ($V_{external}$) received by the processor 105 via the Input/Output (I/O) 115. That is, the sensor 100 can have a ratiometric gain, a fixed or substantially gain, or an externally provided gain. In these examples, the mode of operation of the sensor 100 can be referred to as a ratiometric gain mode, a fixed or substantially fixed gain mode, or an externally provided gain mode, respectively. For the purpose of this disclosure, the gain can also be referred to as the "sensitivity" of the sensor 100 or the "slope" of the output signal generated by the sensor 100.

In an exemplary embodiment, the processor 105 can control the zero-point mode and the gain mode of the sensor 100. In operation, the zero-point mode and the gain mode can be controlled independent of each other. That is, the sensor 100 can operate as any of the zero-point modes in combination with any of the gain modes. The modes of operation of the sensor 100 are described in more detail with respect to FIGS. 2A-2C.

Figure 2A:
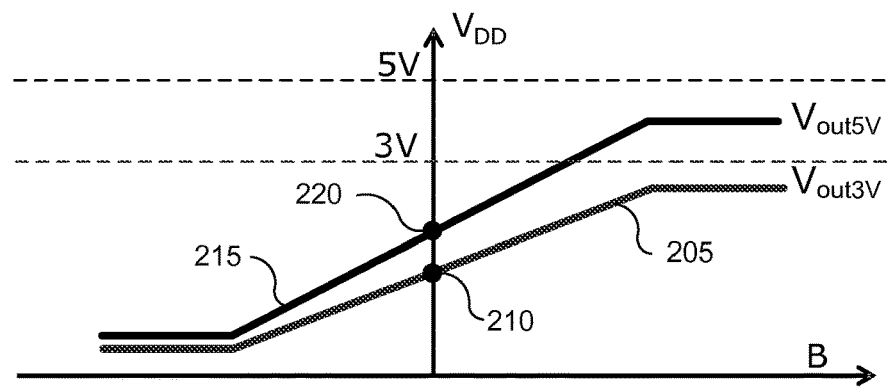
FIGS. 2A-2C illustrate sensor configurations according to exemplary embodiments of the present disclosure.

FIG. 2A illustrates exemplary output signals of the sensor 100 configured to operate in ratiometric zero-point and ratiometric gain modes. FIG. 2A includes two signals 205 and 215 corresponding to two input voltage values ($V_{DD}$) of, for example 3V and 5V, respectively. The input voltages of the sensor 100 are not limited to these exemplary values and can be other voltages as would be understood by those skilled in the relevant arts.

The signal 205 has a zero-point 210 at, for example, 50% of the corresponding $V_{DD}$ (e.g., 1.5V). Similarly, signal 215 has a zero-point 220 at, for example, 50% of the corresponding $V_{DD}$ (e.g., 2.5V). As illustrated, the zero-point values are ratiometric and proportional to the corresponding $V_{DD}$.

The gain (slope) values of the signals 205 and 215 are also ratiometric and proportional to the corresponding input voltage values $V_{DD}$. For example, the slope of the signal 215 corresponding to the $V_{DD}$ of 5V is greater than the slope of the signal 205 corresponding to the $V_{DD}$ of 3V. In this example, the gain (slope) of signal 215 satisfies the following equation:

$$Gain_{215} = \frac{VDD_{215}}{VDD_{205}} \times Gain_{205}$$

where $Gain_{215}$ is the gain of signal 215, $Gain_{205}$ is the gain of signal 205, $VDD_{215}$ is the input voltage value of signal 215, and $VDD_{205}$ is the input voltage of signal 205.

Figure 2B:
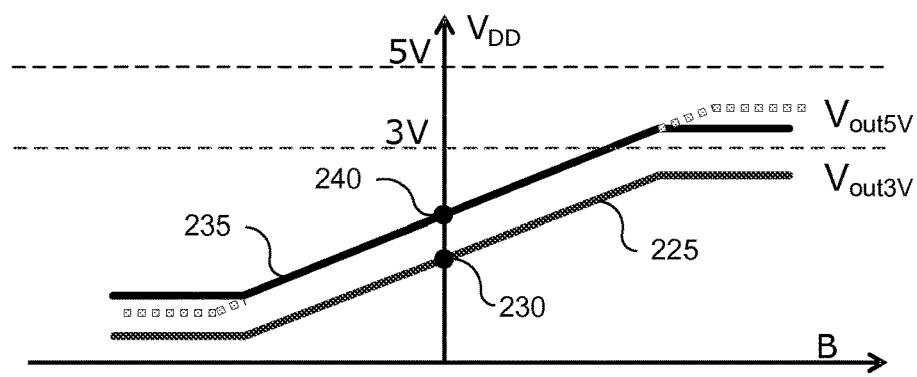

FIG. 2B illustrates exemplary output signals of the sensor 100 configured to operate in a ratiometric zero-point mode and a fixed gain mode. FIG. 2B includes two signals 225 and 235 corresponding to two input voltage values ($V_{DD}$) of, for example 3V and 5V, respectively.

The signal 225 has a zero-point 230 at, for example, 50% of the corresponding $V_{DD}$ (e.g., 1.5V). Similarly, signal 235 has a zero-point 240 at, for example, 50% of the corresponding $V_{DD}$ (e.g., 2.5V). As illustrated, the zero-point values are ratiometric and proportional to the corresponding $V_{DD}$.

Different from the signals illustrated in FIG. 2A, the gain (slope) values of the signals 225 and 235 are fixed. That is, the gain values of the signals are independent of the corresponding input voltage values $V_{DD}$.

Figure 2C:
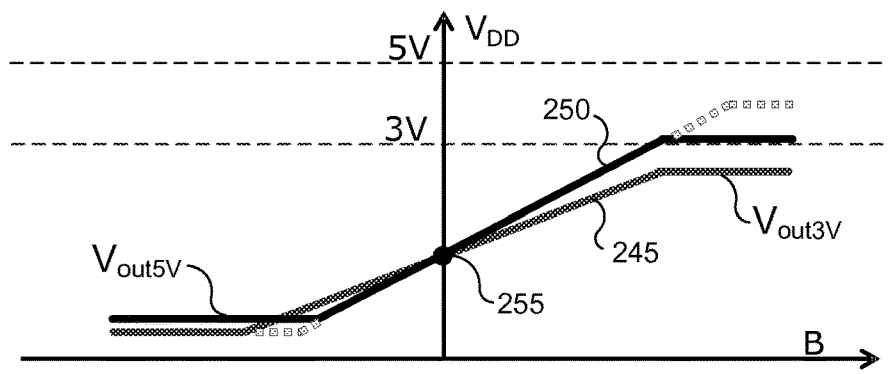

FIG. 2C illustrates exemplary output signals of the sensor 100 configured to operate in a fixed zero-point mode and a ratiometric gain mode. FIG. 2C includes two signals 245 and 250 corresponding to two input voltage values ($V_{DD}$) of, for example 3V and 5V, respectively.

The signals 245 and 250 have a common and fixed zero-point 255. The gain (slope) values of the signals 245 and 250 are ratiometric and proportional to the corresponding input voltage values $V_{DD}$. For example, the slope of the signal 250 corresponding to the $V_{DD}$ of 5V is greater than the slope of the signal 245 corresponding to the $V_{DD}$ of 3V. In this example, the gain (slope) of signal 250 satisfies the following equation:

$$Gain_{250} = \frac{VDD_{250}}{VDD_{245}} \times Gain_{245}$$

where $Gain_{250}$ is the gain of signal 250, $Gain_{245}$ is the gain of signal 245, $VDD_{250}$ is the input voltage value of signal 250, and $VDD_{245}$ is the input voltage of signal 245.

Figure 3A:
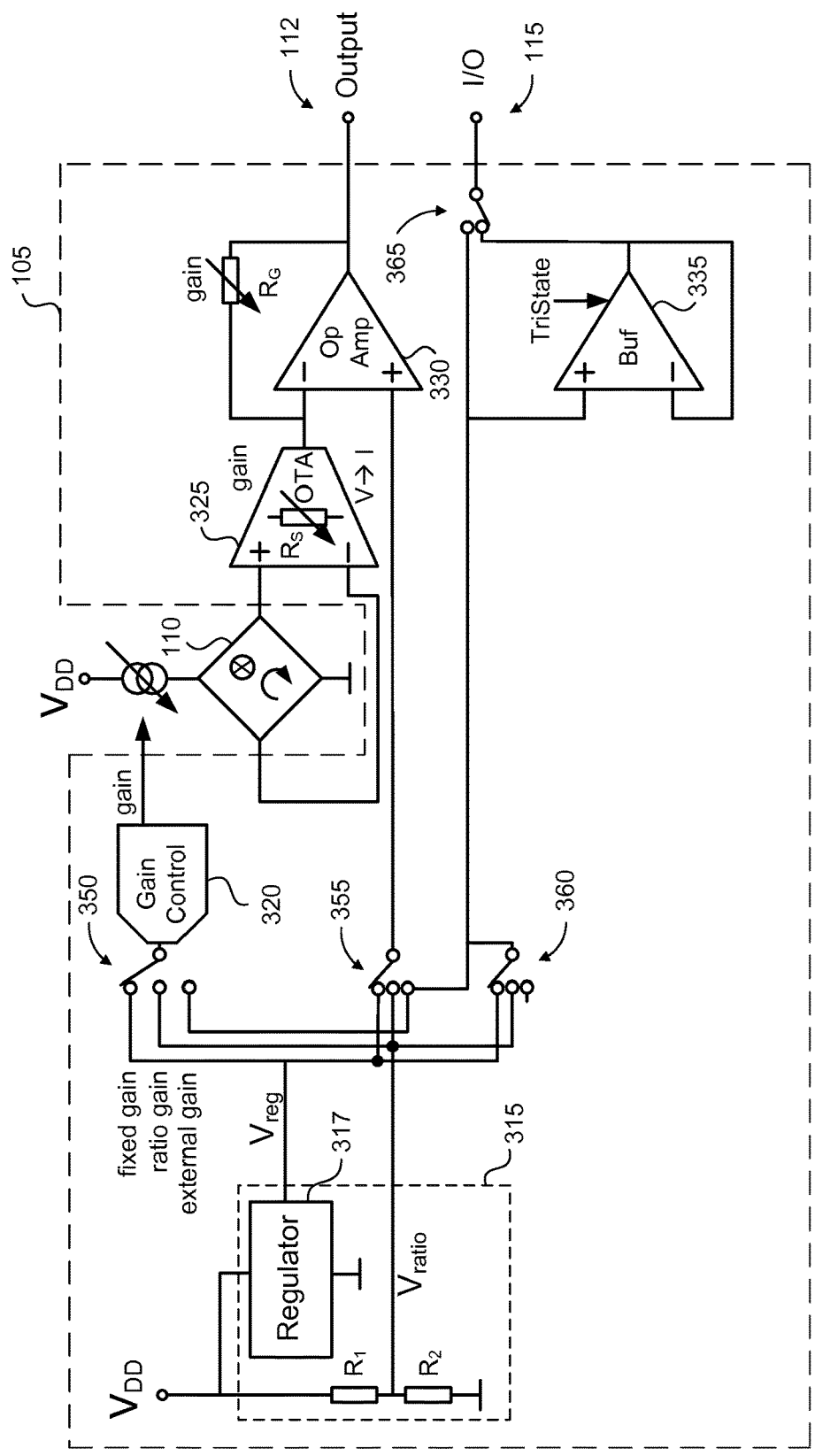
FIGS. 3A-3G illustrate sensors according to exemplary embodiments of the present disclosure.

FIG. 3A illustrates sensor 100 according to an exemplary embodiment of the present disclosure. As discussed above, the sensor 100 can include sensing device 110 electrically (and/or communicatively) connected to processor 105.

In an exemplary embodiment, the processor 105 can include a zero-field output voltage ($V_{zero}$) generator 315, a gain controller 320, an operational transconductance amplifier (OTA) 325, an operational amplifier 330, a buffer 335, and switches 350, 355, 360, and 365. As illustrated in FIG. 3A and discussed in detail below, switches 350 and 355 are positioned for fixed zero-point and fixed gain modes. Switch 360 is positioned to provide a regulated voltage $V_{reg}$ generated by the $V_{zero}$ generator 315 to the switch 365, and switch 365 is positioned in the output position to configure the Input/Output (I/O) 115 as an output of the sensor 100. In this example, the regulated voltage $V_{reg}$ can also be outputted from the I/O 115. In an exemplary embodiment, a differential output of the sensor 100 is defined by the output of the regulated voltage $V_{reg}$ at I/O 115 and the output 112 (output of the operational amplifier 330).

The switches 350, 355, 360, and/or 365 can be multiplexers or demultiplexers. The multiplexers can each be configured to receive multiple inputs and forward a selected one of the inputs as a single output. The demultiplexers can each be configured to receive an input and forward the input to a selected output of multiple outputs. The selection can be based on one or more control signals received by the processor 105 via, for example, the Input/Output (I/O) 115. In an exemplary embodiment, a programming operation can be performed to select the positions of the switches 350, 355, 360, and/or 365. In an exemplary embodiment, the programming operation can be performed before normal operation (e.g., magnetic field sensing operations) of the sensor 100. The programming operation can include a calibration operation to calibrate one or more components of the sensor 100, including, for example, the magnetic field sensing device 110, $V_{zero}$ generator 315, gain controller 320, transconductance amplifier 325, operational amplifier 330, and/or buffer 335. In an exemplary embodiment, the sensor 100 (e.g., processor 105) can include a memory that can store programmed selection(s). For example, the programmed selections can be stored by the user and/or the manufacture (e.g., with a default setting). In operation, I/O 115 is configured as an output when the switch 365 is in a downward position as illustrated in FIGS. 3A-3D. Conversely, the I/O 115 is configured as an input when the switch 365 is in an upward position as illustrated in FIGS. 3E-3G.

The buffer 335 can include processor circuitry that is configured to provide electrical impedance transformation between two or more circuits. The buffer 335 can be a voltage buffer and/or a current buffer configured to transfer voltage and/or current from a first circuit (e.g., having high output impedance) to a second circuit (e.g., having low input impedance). In an exemplary embodiment, the buffer 335 includes an operational amplifier configured as a unity gain buffer amplifier. In this example, the non-inverted input of the buffer 335 serves as the input (e.g., is connected to switch 360) and the inverted input is connected (e.g., shorted) to the output of the buffer 335. The output of the buffer 335 is connected to the Input/Output (I/O) 115 via switch 365.

The $V_{zero}$ generator 315 can include processor circuitry that is configured to generate one or more zero-field output voltages. In an exemplary embodiment, the $V_{zero}$ generator 315 can include a voltage regulator 317 configured to generate a fixed or substantially fixed regulated voltage $V_{reg}$ based on an input voltage (e.g., $V_{DD}$) as one of the zero-field output voltages. The voltage regulator 317 can include processor circuitry configured to regulate an input voltage to generate the regulated voltage $V_{reg}$. For example, the voltage regulator 317 can be a feed-forward regulator, a negative feedback regulator, a linear regulator, a switching regulator, or another regulator as would be understood by those skilled in the relevant arts.

The $V_{zero}$ generator 315 can also be configured to generate a ratiometric voltage $V_{ratio}$ based on an input voltage (e.g., $V_{DD}$) as one of the zero-field output voltage. In this example, the ratiometric voltage $V_{ratio}$ is proportional to the input voltage. For example, the $V_{zero}$ generator 315 can include a voltage divider that includes first and second resistors $R_1$ and $R_2$ connected in series between $V_{DD}$ and ground. In this example, the ratiometric voltage $V_{ratio}$ is the voltage at the node between the resistors $R_1$ and $R_2$, where $V_{ratio}$ satisfies the following equation:

$$V_{ratio} = \frac{R_2}{R_1 + R_2} \times V_{DD}$$

The $V_{zero}$ generator 315 can be configured to connect to the gain controller 320 via switch 350, to the non-inverted input of the operational amplifier 330 via switch 355, and to the Input/Output (I/O) 115 via switch 360, buffer 335, and switch 365. In operation, the $V_{zero}$ generator 315 can be configured to provide the regulated voltage $V_{reg}$ to the gain controller 320, the non-inverted input of the operational amplifier 330, and/or the I/O 115 via the buffer 335. The $V_{zero}$ generator 315 can also be configured to provide the ratiometric voltage $V_{ratio}$ to the gain controller 320, the non-inverted input of the operational amplifier 330, and/or the I/O 115 via the buffer 335.

The gain controller 320 can include processor circuitry that is configured to control the gain of the processor 105. In operation, the gain controller 320 can generate a gain signal based on one or more input voltages. For example, the gain controller 320 can receive, as an input, the regulated voltage $V_{reg}$ and/or the ratiometric voltage $V_{ratio}$ from the $V_{zero}$ generator 315. The gain controller 320 can receive, as an input, an externally provided voltage ($V_{external}$) received by the processor 105 via the Input/Output (I/O) 115. In operation, the input of the gain controller 320 can be based on the position of switch 350, which can be configured to connect the gain controller 320 to the output of the voltage regulator 317 of the $V_{zero}$ generator 315 (e.g., regulated voltage $V_{reg}$), the output of the voltage divider of the $V_{zero}$ generator 315 (e.g., ratiometric voltage $V_{ratio}$), or the external voltage ($V_{external}$). The position of switch 350 can be controlled by one or more control signals received by the processor 105 via the Input/Output (I/O) 115.

The gain controller 320 can be configured to provide the generated gain signal to one or more components of the sensor 100, and can be used to control the gain of the sensor 100. For example, the gain controller 320 can provide the gain signal to the magnetic field sensing device 110, more particularly, to a current source driving the magnetic field sensing device 110, the OTA 325, and/or the operational amplifier 330. In operation, the current generated by the current source can be adjusted based on the gain signal to adjust the gain of the magnetic field sensing device 110. The transconductance of the OTA 325 can also be adjusted based on the gain signal to adjust the gain of the OTA 325. A feedback resistor $R_G$ can be connected between the output of the operational amplifier 330 and the inverted input of the operational amplifier 330. The resistance of the feedback resistor $R_G$ can be adjusted based on the gain signal to adjust the gain component of the sensor 100 influenced by the operational amplifier 330.

In these examples, the gain of the sensor 100 can include gain components from the magnetic field sensing device 110, the OTA 325, and/or the operational amplifier 330. In operation, one or more of the gain components from these devices can be adjusted to control the overall gain of the sensor 100.

The OTA 325 can include processor circuitry that is configured to receive one or more sensor signals generated by the magnetic field sensing device 110 and to generate an output signal based on the received sensor signal(s). For example, the magnetic field sensing device 110 can include first and second outputs that each provide a voltage signal, when taken together represent a voltage differential generated by the magnetic field sensing device 110. The first and second outputs of the magnetic field sensing device 110 can be connected to the non-inverted input and inverted input, respectively, of the OTA 325. The OTA 325 can generate an output current signal based on the voltages provided by the magnetic field sensing device 110, and can provide the output current signal to the inverted input of the operational amplifier 330. As discussed above, the gain of the OTA 325 can be adjusted based on the gain signal generated by the gain controller 320 by adjusting the transconductance of the OTA 325. In an exemplary embodiment, the OTA 325 can be configured such that the output ($I_{gm}$) of the OTA 325 satisfies the following equation:

$$I_{gm} = \frac{\Delta V_{in}}{R_s}$$

where $\Delta V_{in}$ is the differential input voltage of the OTA 325 and $R_s$ is the sense resistance of the sensor resistor of the OTA 325.

The operational amplifier 330 can include processor circuitry that is configured to receive a differential input (at the inverted and non-inverted inputs of the operational amplifier 330) and to generate an output of based on the differential input. In an exemplary embodiment, the inverted input of the operational amplifier 330 is connected to the output of the OTA 325. The non-inverted input of the operational amplifier 330 is connected to the switch 355 to selectively connect the non-inverted input of the operational amplifier 330 to the regulated voltage $V_{reg}$ output of the $V_{zero}$ generator 315, the ratiometric voltage $V_{ratio}$ output of the $V_{zero}$ generator 315, or an externally provided voltage ($V_{external}$) received by the processor 105 via the Input/Output (I/O) 115. A feedback resistor $R_G$ can be connected between the output of the operational amplifier 330 and the inverted input of the operational amplifier 330. The gain of the operational amplifier 350 can be adjusted based on the resistance of the feedback resistor $R_G$. The resistance of the feedback resistor $R_G$ can be adjusted by a gain signal generated by the gain controller 320.

As illustrated in FIG. 3A, the sensor 100 is configured in fixed zero-point and fixed gain modes. For example, switch 350 and switch 355 are positioned to connect the gain controller 320 and the non-inverted input of the operational amplifier 330 to the regulated voltage $V_{reg}$ output of the regulator 317. Switch 360 is positioned to provide the regulated voltage $V_{reg}$ output of the regulator 317 to the switch 365, and switch 365 is positioned to provide the regulated voltage $V_{reg}$ output of the regulator 317 to the I/O 115 via the buffer 335. In this example, the differential output of the sensor 100 is defined by the output of the regulated voltage $V_{reg}$ at I/O 115 and the output 112 (output of the operational amplifier 330).

Figure 3B:
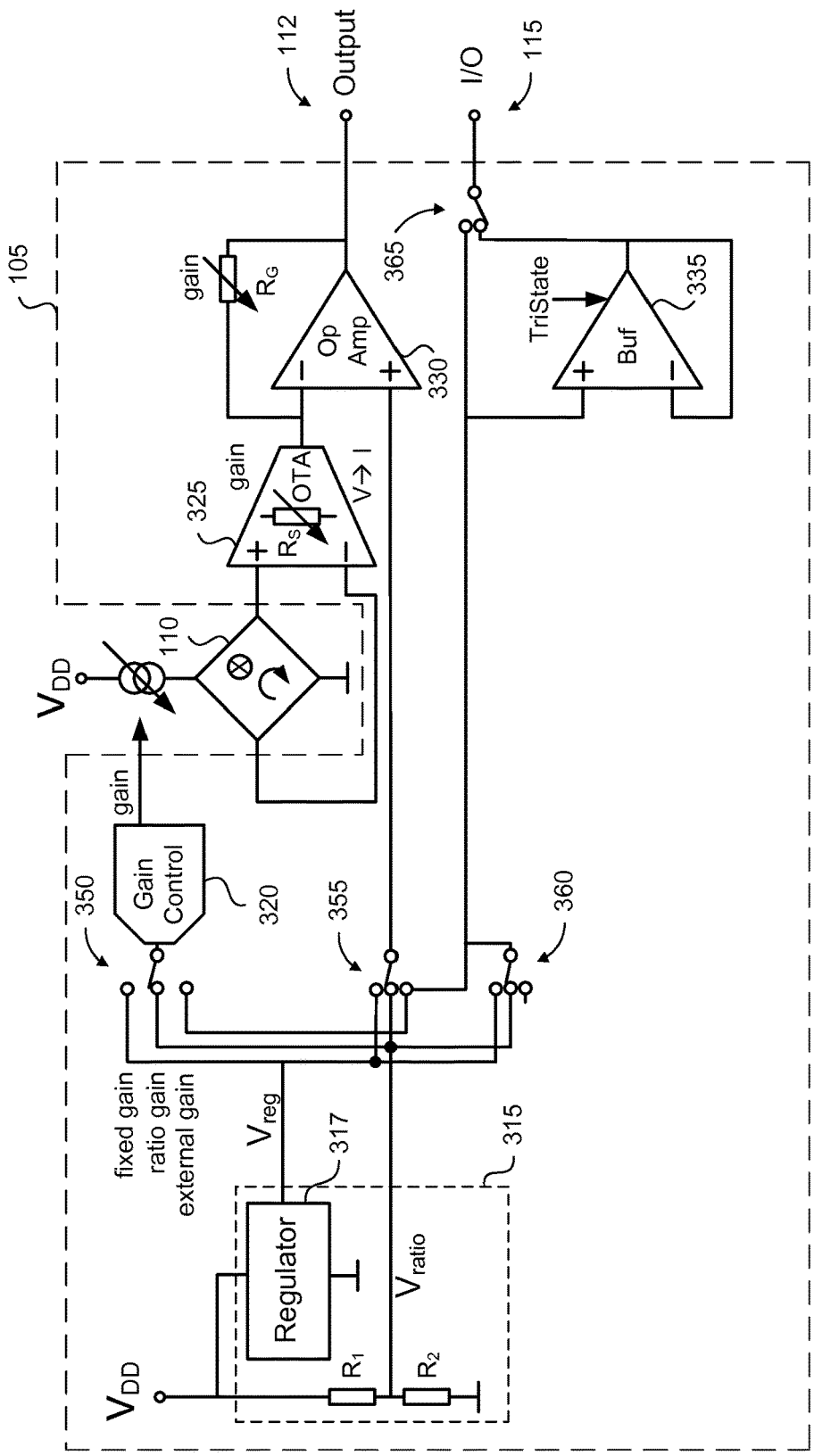

FIG. 3B illustrates sensor 100 according to an exemplary embodiment of the present disclosure. The embodiment is similar to the sensor 100 illustrated in FIG. 3A, but the sensor 100 is configured for ratiometric zero-point and ratiometric gain modes. In this example, the output signals at output 112 will be similar to the exemplary output signals illustrated in FIG. 2A.

In operation, switch 350 and switch 355 are positioned to connect the gain controller 320 and the non-inverted input of the operational amplifier 330 to the ratiometric voltage $V_{ratio}$ output of the $V_{zero}$ generator 315, respectively. Switch 360 is positioned to provide the ratiometric voltage $V_{ratio}$ output of the $V_{zero}$ generator 315 to the switch 365, and switch 365 is positioned to provide the ratiometric voltage $V_{ratio}$ output of the $V_{zero}$ generator 315 to the I/O 115 via the buffer 335. In this example, the differential output of the sensor 100 is defined by the ratiometric voltage $V_{ratio}$ at I/O 115 and the output 112 (output of the operational amplifier 330). In a similar configuration, the switch 360 could be positioned to instead provide the regulated voltage $V_{reg}$ of the regulator 317 to the I/O 115.

Figure 3C:
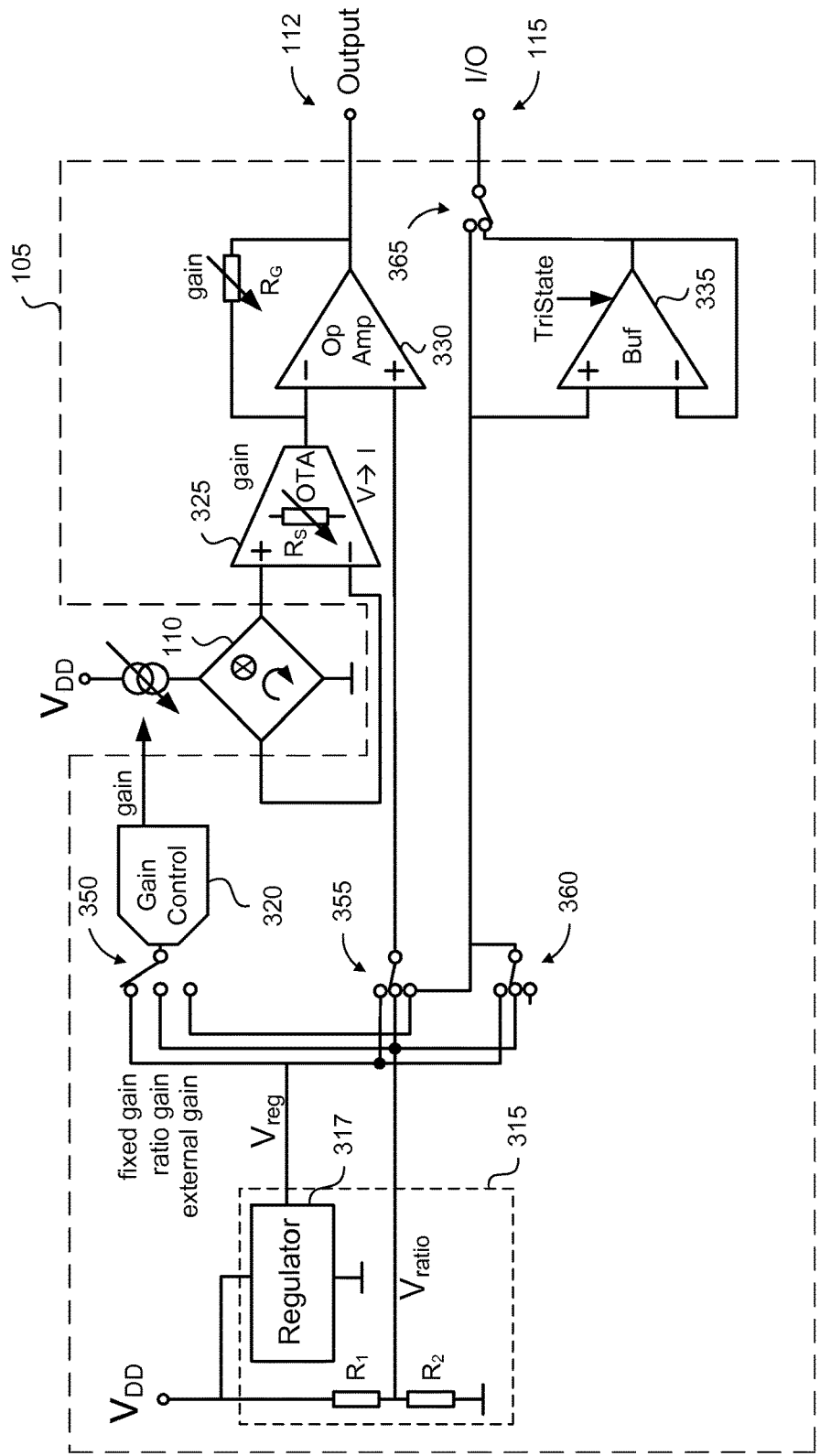

FIG. 3C illustrates sensor 100 according to an exemplary embodiment of the present disclosure. The embodiment is similar to the sensor 100 illustrated in FIGS. 3A-3B, but the sensor 100 is configured for ratiometric zero-point and fixed gain modes. In this example, the output signals at output 112 will be similar to the exemplary output signals illustrated in FIG. 2B.

In operation, switch 350 is positioned to connect the gain controller 320 to the regulated voltage $V_{reg}$ output of the regulator 317. Switch 355 is positioned to connect the non-inverted input of the operational amplifier 330 to the ratiometric voltage $V_{ratio}$ output of the $V_{zero}$ generator 315. Switch 360 is positioned to provide the ratiometric voltage $V_{ratio}$ output of the $V_{zero}$ generator 315 to the switch 365, and switch 365 is positioned to provide the ratiometric voltage $V_{ratio}$ output of the $V_{zero}$ generator 315 to the I/O 115 via the buffer 335. In a similar configuration, the switch 360 could be positioned to instead provide the regulated voltage $V_{reg}$ of the regulator 317 to the I/O 115.

Figure 3D:
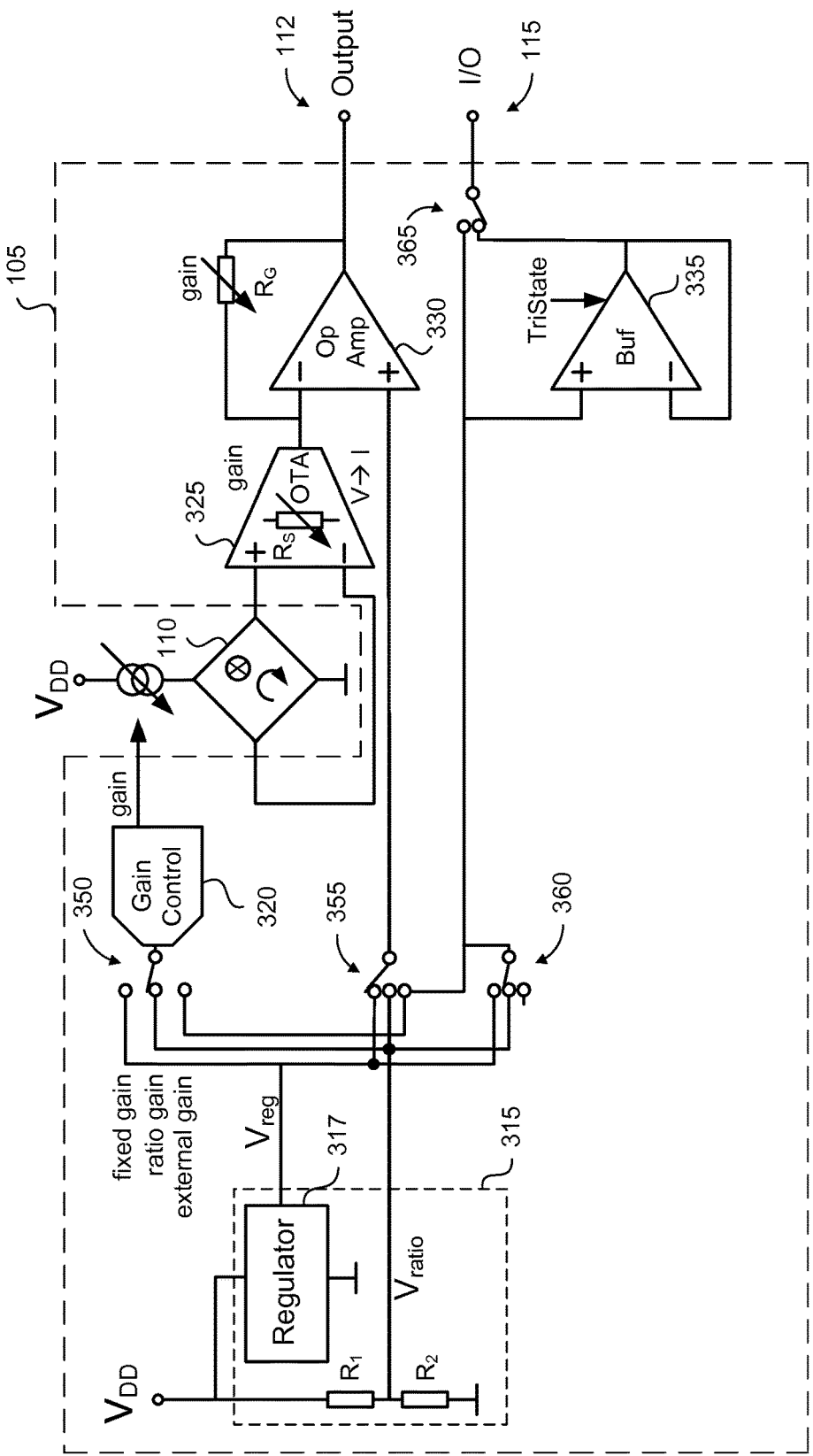
Figure 3E:
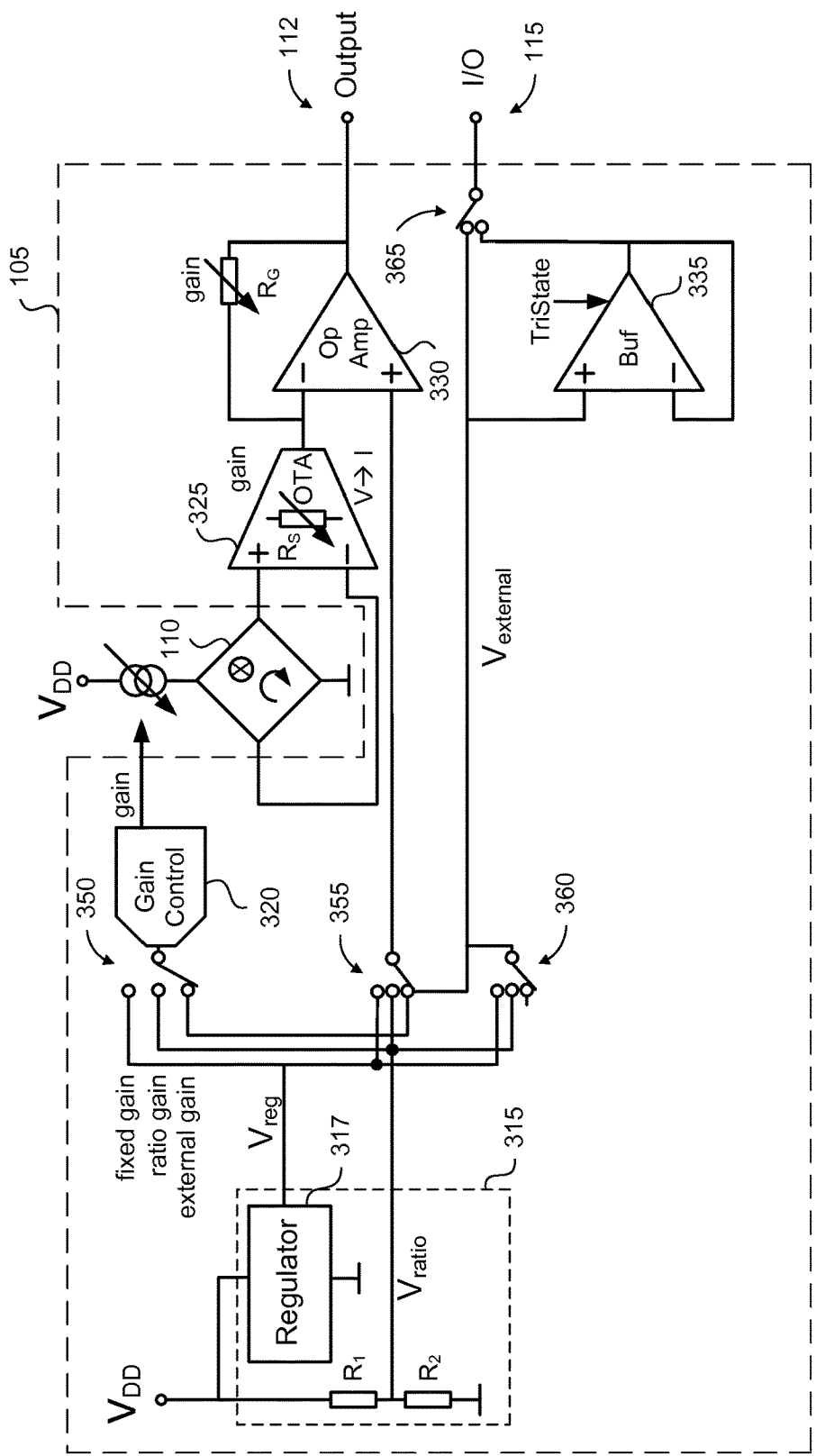
Figure 3F:
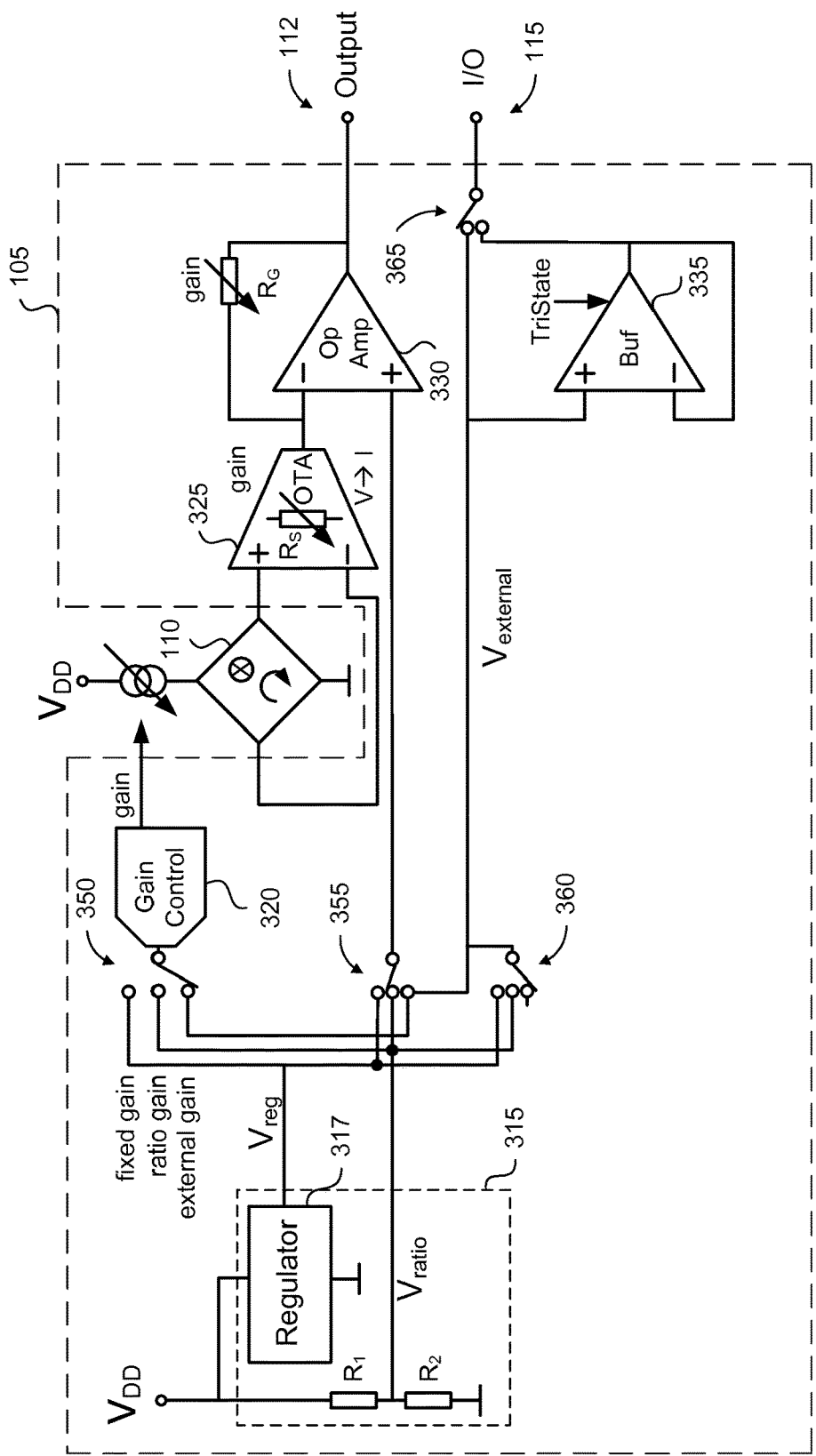
Figure 3G:
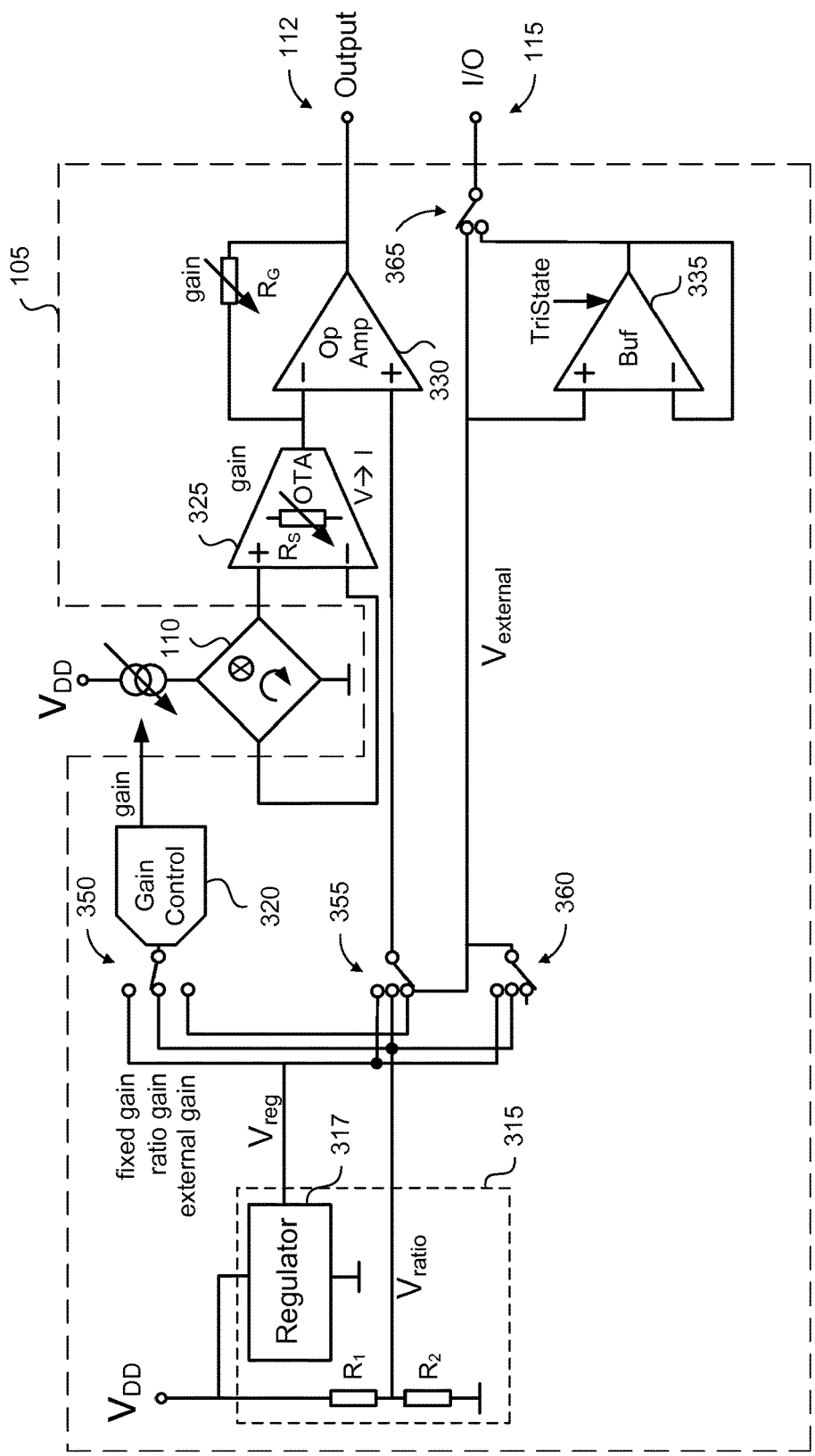

FIG. 3D illustrates sensor 100 according to an exemplary embodiment of the present disclosure. The embodiment is similar to the sensor 100 illustrated in FIGS. 3A-3C, but the sensor 100 is configured for fixed zero-point and ratiometric gain modes. In this example, the output signals at output 112 will be similar to the exemplary output signals illustrated in FIG. 2C.

In operation, switch 350 is positioned to connect the gain controller 320 to the ratiometric voltage $V_{ratio}$ output of the $V_{zero}$ generator 315. Switch 355 is positioned to connect the non-inverted input of the operational amplifier 330 to the regulated voltage $V_{reg}$ output of the regulator 317. Switch 360 is positioned to provide the ratiometric voltage $V_{ratio}$ output of the $V_{zero}$ generator 315 to the switch 365, and switch 365 is positioned to provide the ratiometric voltage $V_{ratio}$ output of the $V_{zero}$ generator 315 to the I/O 115 via the buffer 335. In a similar configuration, the switch 360 could be positioned to instead provide the regulated voltage $V_{reg}$ of the regulator 317 to the I/O 115.

FIG. 3E illustrates sensor 100 according to an exemplary embodiment of the present disclosure. The embodiment is similar to the sensor 100 illustrated in FIGS. 3A-3D, but the sensor 100 is configured for zero-point and gain modes determined based on an externally provided voltage ($V_{external}$) received by the processor 105 via the Input/Output (I/O) 115.

In operation, switch 350 is positioned to connect the gain controller 320 to the I/O 115 via switches 355 and 365. Similarly, switch 355 is positioned to connect the non-inverted input of the operational amplifier 330 to the I/O 115 via switch 365. In this example, the output 112 (output of the operational amplifier 330) and the externally provided voltage ($V_{external}$) on I/O 115 can define a differential output of the sensor 100.

FIG. 3F illustrates sensor 100 according to an exemplary embodiment of the present disclosure. The embodiment is similar to the sensor 100 illustrated in FIGS. 3A-3E, but the sensor 100 is configured for a ratiometric zero-point mode and a gain mode determined based on an externally provided voltage ($V_{external}$) received by the processor 105 via the Input/Output (I/O) 115.

In operation, switch 350 is positioned to connect the gain controller 320 to the I/O 115 via switches 355 and 365. Switch 355 is positioned to connect the non-inverted input of the operational amplifier 330 to the ratiometric voltage $V_{ratio}$ output of the $V_{zero}$ generator 315. In this example, the zero-point of the sensor 100 is proportional to the input voltage $V_{DD}$, while the gain is determined based on the voltage ($V_{external}$) provided to the sensor 100. In a similar configuration, the switch 355 could be positioned to connect the non-inverted input of the operational amplifier 330 to the regulated voltage $V_{reg}$ output of the regulator 317 so as to operate the sensor 100 in a fixed zero-point mode.

FIG. 3G illustrates sensor 100 according to an exemplary embodiment of the present disclosure. The embodiment is similar to the sensor 100 illustrated in FIGS. 3A-3F, but the sensor 100 is configured for a ratiometric gain mode and a zero-point mode determined based on an externally provided voltage ($V_{external}$) received by the processor 105 via the Input/Output (I/O) 115.

In operation, switch 350 is positioned to connect the gain controller 320 to the ratiometric voltage $V_{ratio}$ output of the $V_{zero}$ generator 315. Switch 355 is positioned to connect the non-inverted input of the operational amplifier 330 to the I/O 115 via switches 355 and 365.

In this example, the gain of the sensor 100 is proportional to the input voltage $V_{DD}$, while the zero-point is determined based on the voltage ($V_{external}$) provided to the sensor 100. In a similar configuration, the switch 350 could be positioned to connect the gain controller 320 to the regulated voltage $V_{reg}$ output of the regulator 317 so as to operate the sensor 100 in a fixed gain mode.

Although exemplary configurations of the sensor 100 are illustrated in FIGS. 3A-3G, the sensor 100 is not limited to these configurations, and the sensor 100 may be configured to operate in any combination of fixed, ratiometric, and/or externally provided modes for the zero-point and/or gain configurations of the sensor 100.

Figure 4A:
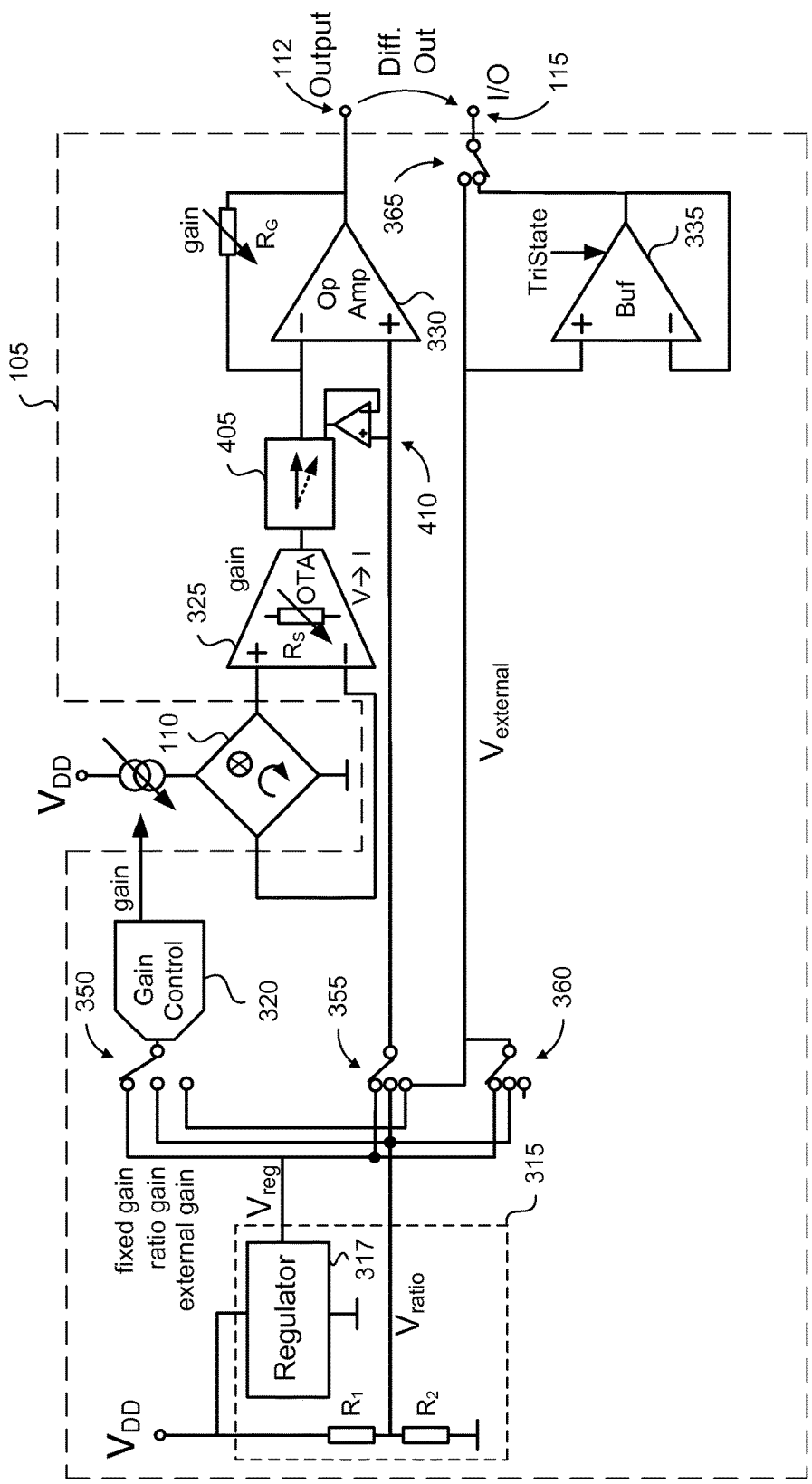
FIGS. 4A-4D illustrate sensors according to exemplary embodiments of the present disclosure.

FIG. 4A illustrates sensor 100 according to an exemplary embodiment of the present disclosure. The embodiment is similar to the sensor 100 illustrated in FIGS. 3A-3G, and discussion of common elements and/or functions may have been omitted for brevity.

In an exemplary embodiment, the sensor 100 illustrated in FIG. 4A is a differential sensor, where the differential output of the sensor 100 is defined by the output of the buffer 335 at I/O 115 and the output 112 (output of the operational amplifier 330).

As illustrated in FIG. 4A, the sensor 100 can include a current divider 405 connected between the output of the operational transconductance amplifier (OTA) 325 and the inverted input of the operational amplifier 330. In an exemplary aspect, the current divider 405 can be a programmable current divider. The current divider 405 can include processor circuitry that is configured to generate an output current and provide the output current to the inverted input of the operational amplifier 330. The output current is generated based on the output signal (e.g., the output current) generated by the OTA 325. In an exemplary embodiment, the output current of the current divider 405 is a ratio (e.g., a fraction) of the input current. In an exemplary embodiment, the current(s) output from the current divider 405 can be adjusted to adjust the gain of the sensor 100.

The current divider 405 can include a second output that can be connected to the non-inverted input of the operational amplifier 330. In an exemplary embodiment, the second output of the current divider 405 can be connected to the non-inverted input of the operational amplifier 330 via an operational amplifier 410. In this example, the second output of the current divider 405 can be connected to the inverted input and the output of the operational amplifier 410. The non-inverted input of the operation amplifier 410 can be connected to switch 355 and the non-inverted input of the operational amplifier 330. In an exemplary embodiment, the operational amplifier 410 includes processor circuitry configured to perform the operations and/or functions of the operational amplifier 410.

In an exemplary embodiment, the operational amplifier 410 can be omitted and the buffer 335 can be configured to perform the operations/functions of the operational amplifier 410. In this example, the sensor 100 can include one or more switches configured to selectively connect the output of the current driver 405 and the switches 355, 360, and/or 365 to the buffer 335. In operation, the one or more switches allow for the buffer 335 to perform the functions of the buffer 335 described herein as well as the functions/operations of the operational amplifier 410.

Figure 4B:
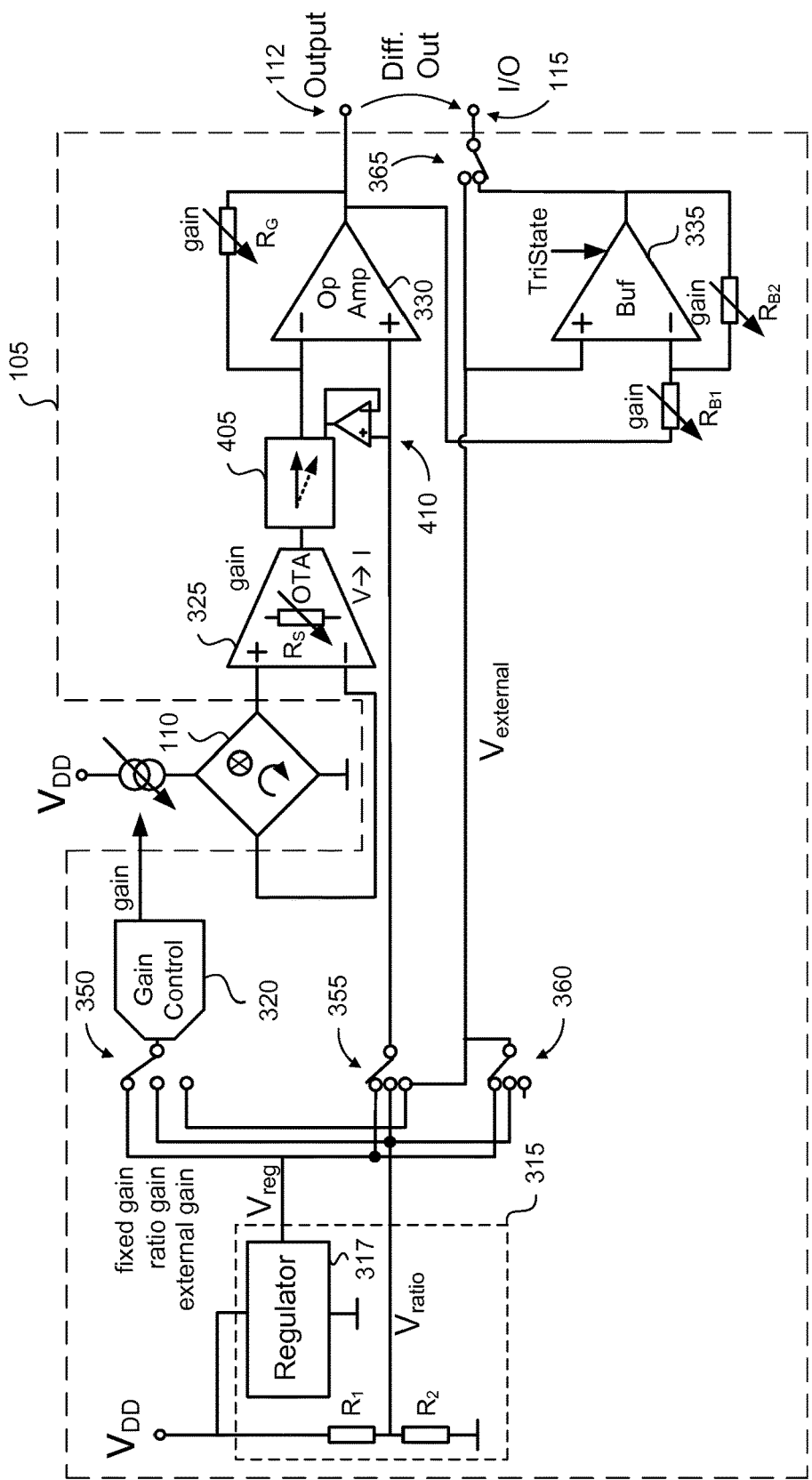

FIG. 4B illustrates sensor 100 according to an exemplary embodiment of the present disclosure. The embodiment is similar to the sensor 100 illustrated in FIG. 4A, and discussion of common elements and/or functions may have been omitted for brevity.

In an exemplary embodiment, the sensor 100 illustrated in FIG. 4B is a differential sensor, where the differential output of the sensor 100 is defined by the output of the buffer 335 at I/O 115 and the output 112 (output of the operational amplifier 330).

Similar to the sensor 100 illustrated in FIG. 4A, the sensor illustrated in FIG. 4B also includes current divider 405 and operational amplifier 410. In the sensor 100 of FIG. 4B, the inverted input of buffer 335 is connected to the output of the operational amplifier 330 via a voltage divider formed by resistors $R_{B1}$ and $R_{B2}$. In operation, the values of resistors $R_{B1}$ and $R_{B2}$ can be adjusted to adjust the voltage at the inverted input of the buffer 335. The adjustment of the resistors $R_{B1}$ and $R_{B2}$ can also adjust the gain of the sensor 100. In an exemplary embodiment, the current(s) output from the current divider 405 can be adjusted to adjust the gain of the sensor 100.

Figure 4C:
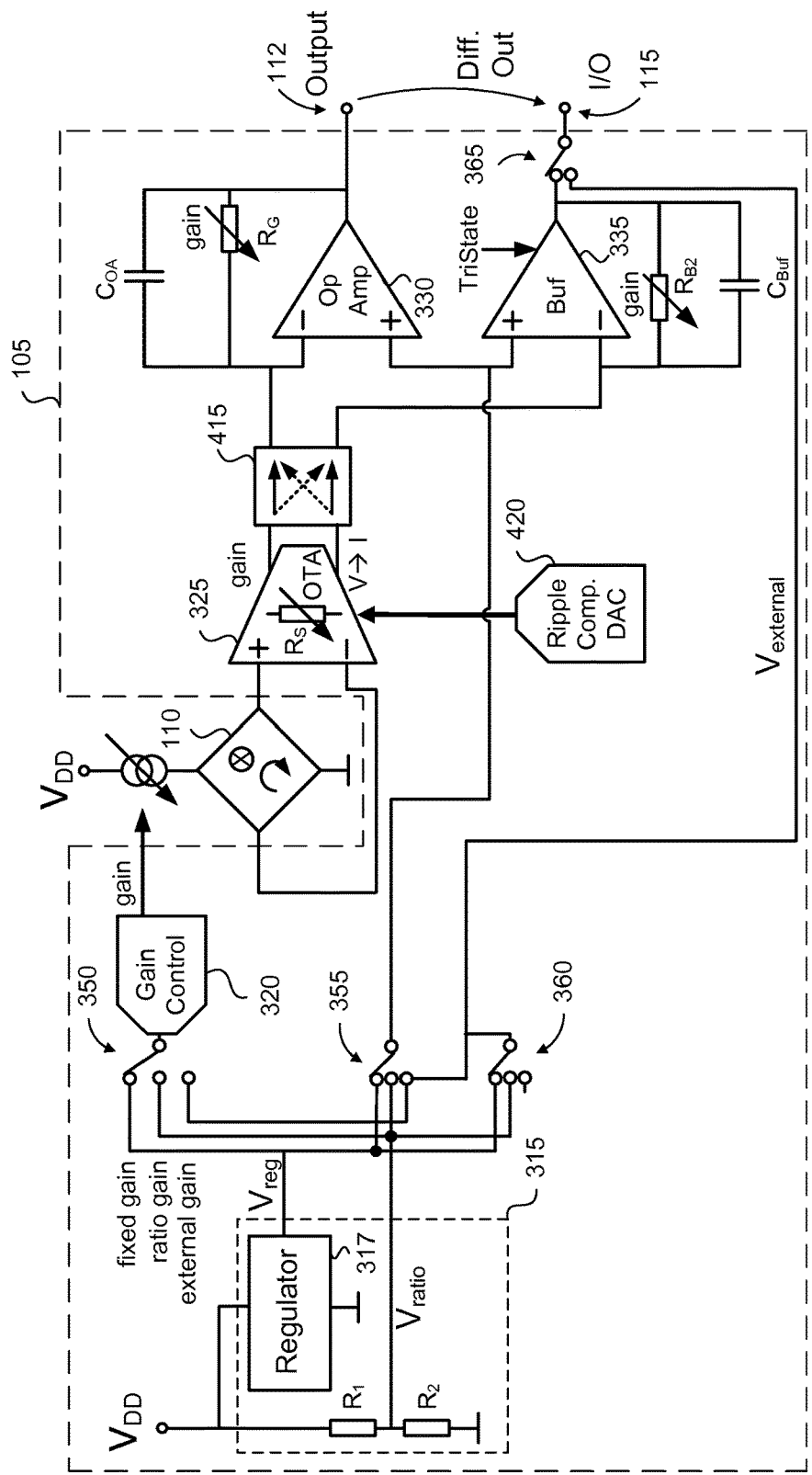

FIG. 4C illustrates sensor 100 according to an exemplary embodiment of the present disclosure. The embodiment is similar to the sensor 100 illustrated in FIGS. 4A and 4B, and discussion of common elements and/or functions may have been omitted for brevity.

In an exemplary embodiment, the sensor 100 illustrated in FIG. 4C is a differential sensor, where the differential output of the sensor 100 is defined by the output of the buffer 335 at I/O 115 and the output 112 (output of the operational amplifier 330). In an exemplary embodiment, the output 112 ($V_{out}$) satisfies the following equation:

$$V_{out} = \frac{\Delta V_{in}}{R_s} \times R_G$$

where $\Delta V_{in}$ is the differential input voltage of the OTA 325, $R_s$ is the sense resistance of the sensor resistor of the OTA 325, and $R_G$ is the resistance of the feedback resistor $R_G$.

As illustrated in FIG. 4C, the operational transconductance amplifier (OTA) 325 is configured to generate first and second outputs, where the first output is supplied to the inverted input of the operational amplifier 330 and the second output supplied to the inverted input of the buffer 335.

The sensor 100 of FIG. 4C can include a current divider 415 connected between the outputs of the operational transconductance amplifier (OTA) 325 and the operational amplifier 330 and the buffer 335. That is, the first output is connected to the operational amplifier 330 via the current divider 415 and the second output is connected to the buffer 335 via the current divider 415. In an exemplary aspect, the current divider 415 can be a programmable current divider. The current divider 415 can include processor circuitry that is configured to generate first and second output currents and provide the first and second output currents to the inverted input of the operational amplifier 330 and the inverted input of the buffer, respectively. The output currents are generated based on the output signals (e.g., the output currents) generated by the OTA 325. In an exemplary embodiment, the output currents of the current divider 415 are ratios (e.g., fractions) of the input current. In an exemplary embodiment, the current(s) output from the current divider 415 can be adjusted to adjust the gain of the sensor 100.

In an exemplary embodiment, the processor 105 can include a ripple compensation digital-to-analog converter (DAC) 420 configured to reduce ripple generated by chopping. In this example, the ripple compensation DAC 420 can be configured to reduce the offset of the OTA 325 thereby reducing ripple at the output of the OTA 325. The ripple compensation DAC 420 can include two outputs that are connected across the sensor resistor $R_S$ of the OTA 325 to control ripple of the OTA 325. Further, the ripple compensation DAC 420 may be included in one or more other embodiments of the sensor 100 described herein although it may not be illustrated.

As illustrated in FIG. 4C, switch 355 is connected to the non-inverted input of the operational amplifier 330 and the non-inverted input of the buffer 335. The buffer 335 can also include a resistor $R_{B2}$ in a feedback signal path from the output of the buffer 335 to the inverted input of the buffer 335. The resistance of the resistor $R_{B2}$ can be adjusted to adjust the gain of the sensor 100. The feedback path of the buffer 335 can also include a capacitor $C_{Buf}$ connected between the output of the buffer 335 to the inverted input of the buffer 335. Similarly, the feedback path of the operational amplifier 330 can also include a capacitor $C_{OA}$ connected between the output of the operational amplifier 330 to the inverted input of the operational amplifier 330. The capacitor $C_{Buf}$ and/or capacitor $C_{OA}$ can be configured to provide increased stability and/or reduced noise in the sensor 100. The capacitance of the capacitor $C_{Buf}$ and/or the capacitor $C_{OA}$ can be adjusted as would be understood by those skilled in the relevant arts. Further, the capacitor $C_{Buf}$ and/or capacitor $C_{OA}$ may be included in one or more other embodiments of the sensor 100 described herein although such capacitors may not be illustrated.

In an exemplary embodiment, the gain of the sensor 100 can be coarsely and finely adjusted. For example, the gain of the sensor 100 can be coarsely adjusted based on the current division of the current divider 415 and finely adjusted based on the resistance of the feedback resistor $R_{B2}$ in the feedback path of the buffer 335.

Figure 4D:
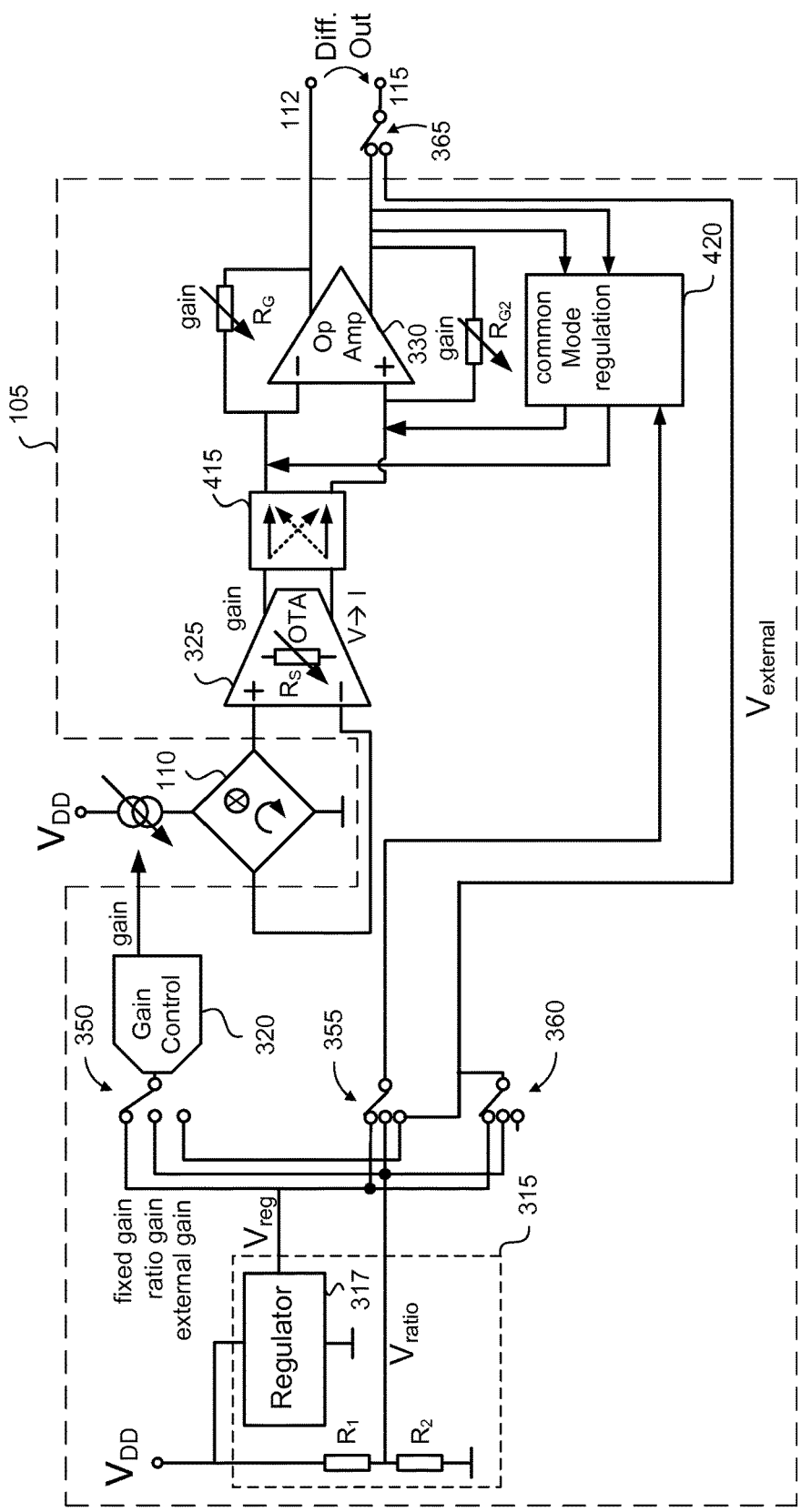

FIG. 4D illustrates sensor 100 according to an exemplary embodiment of the present disclosure. The embodiment is similar to the sensor 100 illustrated in FIGS. 4A-4C, and discussion of common elements and/or functions may have been omitted for brevity.

In an exemplary embodiment, the sensor 100 illustrated in FIG. 4D is a differential sensor, where the differential output of the sensor 100 is defined by the outputs of the operational amplifier 330 at I/O 115 and at the output 112.

As illustrated in FIG. 4D, the operational transconductance amplifier (OTA) 325 is configured to generate first and second outputs, where the first output is supplied to the inverted input of the operational amplifier 330 via current divider 415 and the second output supplied to the non-inverted input of the operational amplifier 330 via the current divider 415. That is, the sensor 100 of FIG. 4C can include current divider 415 connected between the outputs of the operational transconductance amplifier (OTA) 325 and the inputs of the operational amplifier 330.

In an exemplary aspect, the current divider 415 can be a programmable current divider. The current divider 415 can include processor circuitry that is configured to generate first and second output currents and provide the first and second output currents to the inputs of the operational amplifier 330. The output currents are generated based on the output signals (e.g., the output currents) generated by the OTA 325. In an exemplary embodiment, the output currents of the current divider 415 are ratios (e.g., fractions) of the input current. In an exemplary embodiment, the current(s) output from the current divider 415 can be adjusted to adjust the gain of the sensor 100.

In an exemplary embodiment, the operational amplifier 330 includes first and second outputs, where the first output is connected output 112 and the second output is connected to I/O 115. A feedback resistor $R_G$ can be connected between the first output of the operational amplifier 330 and the inverted input of the operational amplifier 330. Similarly, a feedback resistor $R_{G2}$ can be connected between the second output of the operational amplifier 330 and the non-inverted input of the operational amplifier 330. In operation, the resistances of the feedback resistors $R_G$ and/or $R_{G2}$ can be adjusted to adjust the gain component of the sensor 100 influenced by the operational amplifier 330.

As illustrated in FIG. 4D, the sensor 100 can include a common mode regulator 420. The common mode regulator 420 can replace the buffer 335 found in one or more other embodiments. The common mode regulator 420 can include processor circuitry that is configured to perform common-mode regulation of one or more outputs of the operational amplifier 330 based on the voltage supplied via switch 335. For example, the common mode regulator 420 can be configured to receive the second output of the operational amplifier 330 (e.g., I/O 115) and provide a regulated output to the inverted and/or non-inverted inputs of the operational amplifier 330. In operation, the regulation can be based on, for example, the voltage supplied to the common mode regulator 330 via the switch 335 (e.g., $V_{reg}$, $V_{ratio}$). In an exemplary embodiment, the common mode regulation can be used to adjust the gain of the sensor 100.

Figure 5:
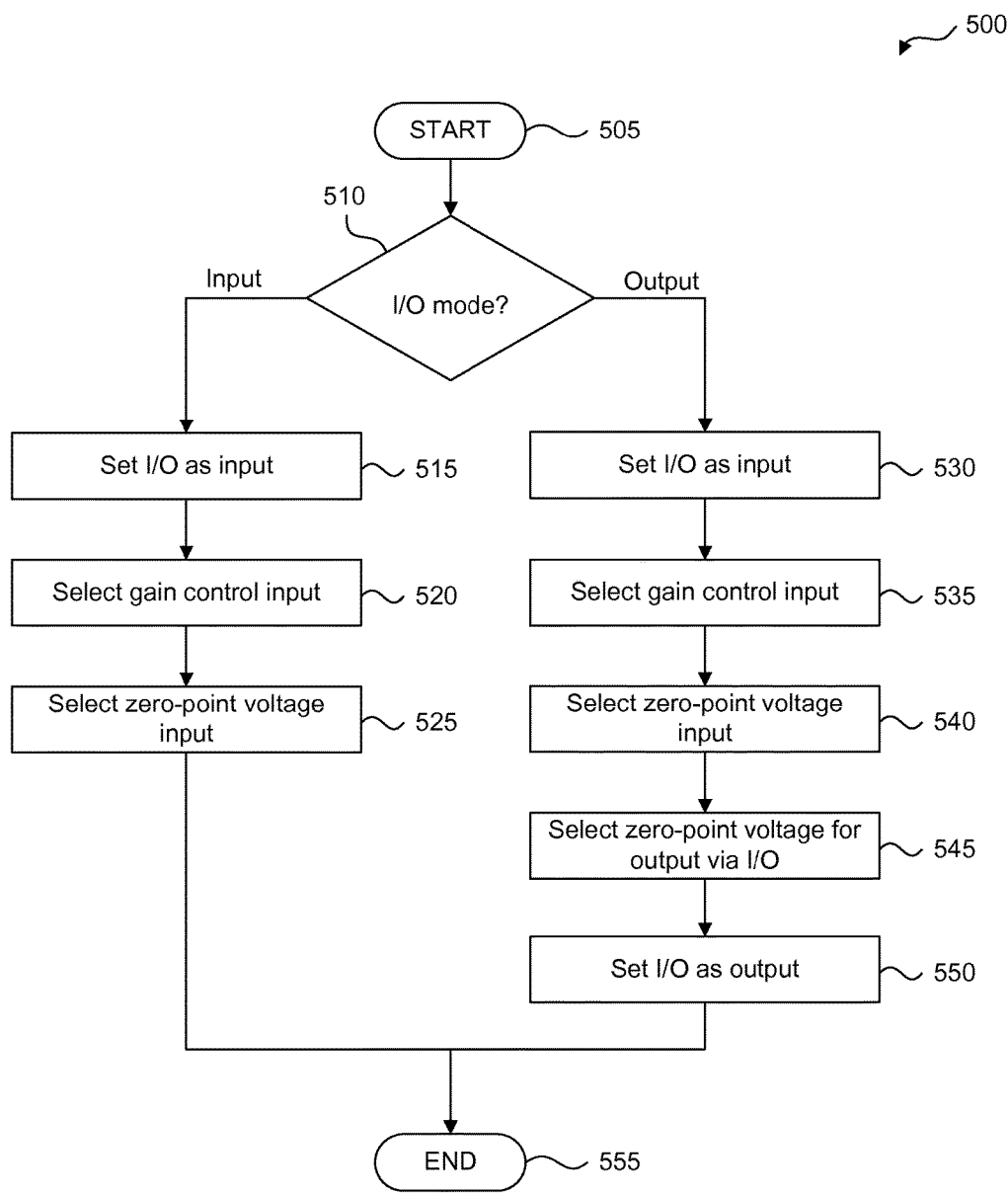
FIG. 5 illustrates a mode selection method according to an exemplary embodiment of the present disclosure.

FIG. 5 illustrates a flowchart of mode selection method 500 according to an exemplary embodiment of the present disclosure. The flowchart is described with continued reference to FIGS. 1-3G. The steps of the method are not limited to the order described below, and the various steps may be performed in a different order. Further, two or more steps of the method may be performed simultaneously with each other.

The method of flowchart 500 begins at step 505 and transitions to step 510, where the Input/Output configuration of the Input/Output (I/O) 115 is determined. For example, it is determined if the I/O 115 is to be configured as an input, or if the I/O 115 is to be configured as an output. In an exemplary embodiment, the processor 105 can determine the configuration of the I/O 115 based on one or more control signals received by the processor 105 via, for example, the I/O 115.

If the I/O 115 is to be configured as an input, the flowchart 500 transitions to step 515. If the I/O 115 is to be configured as an output, the flowchart 500 transitions to step 530.

At step 515, the I/O 115 is configured as an input. In an exemplary embodiment, the processor 105 can set the position of switch 365 to an input position (e.g., the "up" position as in FIGS. 3E-3G). For example, the position of switch 365 can be based on one or more control signals received by the processor 105 via the I/O 115.

After step 515, the flowchart 500 transitions to step 520, where the gain mode is determined (e.g., the input of the gain controller 320 is selected). For example, the processor 105 can determine whether the input to the gain controller 320 is to be selectively connected to: a regulated voltage $V_{reg}$ output of the $V_{zero}$ generator 315, a ratiometric voltage $V_{ratio}$ output of the $V_{zero}$ generator 315, or the I/O 115 configured as an input and operable to receive an externally provided voltage ($V_{external}$). In an exemplary embodiment, the processor 105 can set the position of the switch 350 to selectively connect the gain controller 350 to the corresponding input.

After step 520, the flowchart 500 transitions to step 525, where the zero-point mode is determined (e.g., the non-inverted input of the operational amplifier 330 is selected). For example, the processor 105 can determine whether the non-inverted input of the operational amplifier 330 is to be selectively connected to: a regulated voltage $V_{reg}$ output of the $V_{zero}$ generator 315, a ratiometric voltage $V_{ratio}$ output of the $V_{zero}$ generator 315, or the I/O 115 configured as an input and operable to receive an externally provided voltage ($V_{external}$). In an exemplary embodiment, the processor 105 can set the position of the switch 355 to selectively connect the non-inverted input of the operational amplifier 330 to the corresponding input.

At step 530, the I/O 115 is configured as an input. In an exemplary embodiment, the processor 105 can set the position of switch 365 to an input position (e.g., the "up" position as in FIGS. 3E-3G). For example, the position of switch 365 can be based on one or more control signals received by the processor 105 via the I/O 115.

After step 530, the flowchart 500 transitions to step 535, where the gain mode is determined (e.g., the input of the gain controller 320 is selected). For example, the processor 105 can determine whether the input to the gain controller 320 is to be selectively connected to: a regulated voltage $V_{reg}$ output of the $V_{zero}$ generator 315 or a ratiometric voltage $V_{ratio}$ output of the $V_{zero}$ generator 315. In an exemplary embodiment, the processor 105 can set the position of the switch 350 to selectively connect the gain controller 350 to the corresponding input. The position of switch 350 can be based on one or more control signals received by the processor 105 via the I/O 115.

After step 535, the flowchart 500 transitions to step 540, where the zero-point mode is determined (e.g., the non-inverted input of the operational amplifier 330 is selected). For example, the processor 105 can determine whether the non-inverted input of the operational amplifier 330 is to be selectively connected to: a regulated voltage $V_{reg}$ output of the $V_{zero}$ generator 315 or a ratiometric voltage $V_{ratio}$ output of the $V_{zero}$ generator 315. In an exemplary embodiment, the processor 105 can set the position of the switch 355 to selectively connect the non-inverted input of the operational amplifier 330 to the corresponding input. The position of switch 355 can be based on one or more control signals received by the processor 105 via the I/O 115.

After step 540, the flowchart 500 transitions to step 545, where the zero-point output mode is determined (e.g., the output of the $V_{zero}$ generator 315 that is to be output via the I/O 115 is determined). For example, the processor 105 can determine whether a regulated voltage $V_{reg}$ output of the $V_{zero}$ generator 315 or a ratiometric voltage $V_{ratio}$ output of the $V_{zero}$ generator 315 is to be provided to the I/O 115 as an output of the sensor 100. In an exemplary embodiment, the processor 105 can set the position of the switch 360 to selectively connect the I/O 115 to the corresponding voltage output from the $V_{zero}$ generator 315. The position of switch 360 can be based on one or more control signals received by the processor 105 via the I/O 115.

After step 545, the flowchart 500 transitions to step 550, where the I/O 115 is configured as an output. In an exemplary embodiment, the processor 105 can set the position of switch 365 to an output position (e.g., the "down" position as in FIGS. 3A-3D). For example, the position of switch 365 can be based on one or more control signals received by the processor 105 via the I/O 115.

After steps 525 or 550, the flowchart 500 transitions to step 555, where the flowchart 500 ends. The flowchart 500 may be repeated one or more times.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to embodiments described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A sensor system comprising:
   a sensor configured to sense one or more environmental conditions and to generate a sensor signal based on the sensed one or more environmental conditions; and
   processor circuitry including an output, a switchable input/output (I/O), a gain switch, and a zero-point switch, the processor circuitry being coupled to the sensor and configured to:
      generate, based on a supply voltage of the sensor, a ratiometric voltage and a regulated voltage;
      adjust the gain switch based on a selection signal received by the processor circuitry via the switchable I/O operating as an input to determine a gain mode of the sensor system;
      adjust the zero-point switch based on the selection signal to determine a zero-point mode of the sensor system;
      adjust the switchable I/O to operate as a second output of the processor circuitry;
      generate a first output signal of the sensor system based on the sensor signal and the gain and zero-point modes of the sensor system and provide the first output signal at the output; and
      generate a second output signal of the sensor system based on the zero-point mode of the sensor and a selection of one of the ratiometric voltage and the regulated voltage, and provide the second output signal at the switchable I/O operating at the second output.

2. The sensor system of claim 1, wherein the processor circuitry is further configured to:
   select one of the ratiometric voltage and the regulated voltage via the gain switch to determine the gain mode; and
   select one of the ratiometric voltage and the regulated voltage via the zero-point switch to determine the zero-point mode.

3. The sensor system of claim 1, wherein the processor circuitry is configured to provide a differential signal via the output and the switchable I/O operating as the second output.

4. The sensor system of claim 1, wherein the processor circuitry comprises:
   a zero-field output voltage generator configured to generate the regulated voltage and the ratiometric voltage.

5. The sensor system of claim 4, wherein the zero-field output voltage generator comprises:
   a voltage regulator configured to generate the regulated voltage.

6. The sensor system of claim 4, wherein the zero-field output voltage generator comprises:
   first and second resistors that form a voltage divider configured to generate the ratiometric voltage.

7. The sensor system of claim 1, wherein the sensor comprises a magnetic field sensor, and wherein the one or more environmental conditions comprises one or more magnetic fields.

8. The sensor system of claim 1, wherein the processor circuitry is further configured to:
   select, via the gain switch, one of the ratiometric voltage, the regulated voltage, and an external signal received by the processor circuitry to determine the gain mode; and
   select, via the zero-point switch, one of the ratiometric voltage, the regulated voltage, and the external signal to determine the zero-point mode.

9. A sensor system comprising:
   a sensor configured to sense one or more environmental conditions and to generate a sensor signal based on the sensed one or more environmental conditions; and
   processor circuitry including an output, a switchable input/output (I/O), a gain switch, and a zero-point switch, the processor circuitry being coupled to the sensor and configured to:
      generate, based on a supply voltage of the sensor, a ratiometric voltage and a regulated voltage;
      adjust the gain switch based on a control signal received by the processor circuitry via the switchable I/O operating as an input to determine a gain mode of the sensor system based on a selection of one of the ratiometric voltage, the regulated voltage, and an external signal received by the processor circuitry via the switchable I/O operating as the input;
      adjust the zero-point switch based on the control signal to determine a zero-point mode of the sensor system based on a selection by the zero-point switch of one of the ratiometric voltage, the regulated voltage, and the external signal; and
      generate a first output signal of the sensor based on the sensor signal and the gain and zero-point modes of the sensor system and provide the first output signal via the output.

10. The sensor system of claim 9, wherein the first output signal and the received external signal form a differential signal.

11. The sensor system of claim 9, wherein the sensor comprises a magnetic field sensor, and wherein the one or more environmental conditions comprises one or magnetic fields.

12. The sensor system of claim 9, wherein the processor circuitry comprises:
    a zero-field output voltage generator configured to generate the regulated voltage and the ratiometric voltage.

13. The sensor system of claim 12, wherein the zero-field output voltage generator comprises:
    a voltage regulator configured to generate the regulated voltage.

14. The sensor system of claim 12, wherein the zero-field output voltage generator comprises:
    first and second resistors that form a voltage divider configured to generate the ratiometric voltage.

15. The sensor system of claim 9, wherein the external signal is received from a device external to the sensor.

16. A sensor system comprising:
    a sensor configured to sense one or more environmental conditions and to generate a sensor signal based on the sensed one or more environmental conditions; and
    processor circuitry coupled to the sensor and including an output, a switchable input/output (I/O), a gain switch, a zero-point switch, and a zero-field output voltage generator having a voltage divider that is configured to generate a ratiometric voltage based on a supply voltage of the sensor and a regulator that is configured to generate a regulated voltage based on the supply voltage, wherein the processor circuitry is configured to:

receive an external selection signal via the switchable I/O operating as an input;

adjust the gain switch based on the selection signal to determine a gain mode of the sensor;

adjust the zero-point switch based on the selection signal to determine a zero-point mode of the sensor; and generate a first output signal of the sensor based on the sensor signal and the gain and zero-point modes of the sensor.

17. The sensor system of claim 16, wherein the voltage divider is formed by first and second resistors.

18. The sensor system of claim 16, wherein at least one of the gain mode and the zero-point mode determinations are based on a selection of one of the ratiometric voltage, the regulated voltage, and an external signal received via the switchable I/O operating as the input, and wherein the selection is based on the selection signal.

* * * * *